US009368894B2

(12) United States Patent
Chiba et al.

(10) Patent No.: US 9,368,894 B2

(45) Date of Patent: Jun. 14, 2016

(54) SOCKET FOR ELECTRONIC COMPONENTS

(71) Applicant: ALPS ELECTRIC CO., LTD., Ota-ku, Tokyo (JP)

(72) Inventors: Shigetomo Chiba, Tokyo (JP); Takeshi Murayama, Tokyo (JP); Hiroyuki Takaoka, Tokyo (JP); Takeki Uozumi, Tokyo (JP); Nobuyuki Okuda, Tokyo (JP)

(73) Assignee: ALPS ELECTRIC CO., LTD., Tokyo (JP)

( * ) Notice: Subject to any disclaimer, the term of this patent is extended or adjusted under 35 U.S.C. 154(b) by 0 days.

(21) Appl. No.: 14/755,023

(22) Filed: Jun. 30, 2015

(65) Prior Publication Data

US 2016/0006183 A1 Jan. 7, 2016

(30) Foreign Application Priority Data

Jul. 2, 2014 (JP) ................................ 2014-137100

(51) Int. Cl.

*H01R 13/58* (2006.01)
*H01R 13/11* (2006.01)
*H01R 13/6597* (2011.01)
*H05K 7/10* (2006.01)
*H01R 13/24* (2006.01)

(52) U.S. Cl.

CPC ............ *H01R 13/11* (2013.01); *H01R 13/2407* (2013.01); *H01R 13/6597* (2013.01); *H05K 7/1069* (2013.01); *H01R 13/2435* (2013.01)

(58) Field of Classification Search

CPC ... H01R 13/565; H01R 13/2435; H01R 9/091
USPC .................................................. 439/474, 66
See application file for complete search history.

(56) References Cited

U.S. PATENT DOCUMENTS 5,624,269 A * 4/1997 Kanamori .............. H01R 9/091 439/474
6,206,718 B1 * 3/2001 Takahashi ............. H01R 4/308 439/382
7,867,016 B2 * 1/2011 Nabilek ............... H01R 12/585 439/474
9,083,120 B2 * 7/2015 Chiba .................. H01R 13/648
2013/0303005 A1 11/2013 Chiba et al.
2015/0064984 A1 * 3/2015 Chiba .................. H01R 12/714 439/700

* cited by examiner

*Primary Examiner* — Tho D Ta

(74) *Attorney, Agent, or Firm* — Hunton & Williams LLP

(57) ABSTRACT

A socket for electronic components includes a case that includes through holes of which inner wall surfaces have conductivity, and a ground contact unit that is disposed in one of the through holes and is electrically connected to an inner wall surface of the through hole. The ground contact unit includes a holding member that holds a conductive member and is fixed in the through hole. The conductive member has elasticity, and includes an intermediate portion held by the holding member, an upper extension portion extending upward from the intermediate portion, and a lower extension portion extending downward from the intermediate portion. The lower extension portion includes a ground extension portion that comes into elastic contact with the inner wall surface of the through hole, a fixed portion that is fixed to a substrate, and an impact absorbing portion that is formed between the fixed portion and the intermediate portion.

4 Claims, 13 Drawing Sheets

100 U10 2 3 (3b) 4 Z1 X1 Y1 Y2 X2 Z2 1 1a 3d 3e 3c 3a 300 4g PTM 1b 1 4e (4h) U30 (U10) 2 4 4d (4c) 1a 4d (4c) 3b 3h (3d) PB (BTM) 3b SL 3e 3f Z1 Y2 Y1 Z2

SOCKET FOR ELECTRONIC COMPONENTS

CLAIM OF PRIORITY

This application contains subject matter related to and claims the benefit of Japanese Patent Application No. 2014-137100 filed on Jul. 2, 2014, the entire contents of which is incorporated herein by reference.

BACKGROUND OF THE DISCLOSURE

1. Field of the Disclosure

The present disclosure relates to a socket for electronic components, and more particularly, to a socket for electronic components having high shield performance.

2. Description of the Related Art

In regard to the connection between a precise electronic component and a wiring substrate, the precise electronic component is not directly soldered to the wiring substrate and may be connected to the wiring substrate with a connecting socket (socket for electronic components) interposed therebetween. For this reason, the socket for electronic components requires shield performance in order to protect the precise electronic component. In particular, a socket for electronic components disclosed in Japanese Unexamined Patent Application Publication No. 2013-258131 is known as a socket for electronic components that is used for a precise electronic component including a plurality of connecting terminals like an integrated circuit (IC).

The socket for electronic components disclosed in Japanese Unexamined Patent Application Publication No. 2013-258131 is described below with reference to FIGS. 13A to 13D. FIGS. 13A to 13D are views showing a socket 900 for electronic components disclosed in Japanese Unexamined Patent Application Publication No. 2013-258131. FIG. 13A is a perspective view showing the appearance of the socket 900 for electronic components. FIG. 13B is a schematic view showing the socket 900 for electronic components in an initial state. FIG. 13C is a schematic view showing the socket 900 for electronic components in a state in which a moving member 902 is pressed by an electrode terminal TEM. FIG. 13D is a plan view showing the movement of the moving member 902 when the moving member 902 is pressed by the electrode terminal TEM.

The socket 900 for electronic components disclosed in Japanese Unexamined Patent Application Publication No. 2013-258131 is a socket for electronic components that connects each electrode terminal TEM of an electronic component to the wiring of a wiring substrate pb. A shield body 901, which includes a plurality of openings having conductivity, is disposed on the wiring substrate pb. A contact unit U910, which includes a moving member 902 and an elastic member 903 and electrically connects an electrode terminal TEM of the electronic component to the wiring of the wiring substrate pb, is disposed in an opening 901*b*. The contact unit U910 includes a ground contact portion 902*a* that is electrically connected to the shield body 901. When the contact unit U910 is used for grounding, the ground contact portion 902*a* and the shield body 901 come into contact with each other, and a contact portion 903*d* is connected to the shield body 901 by a method such as soldering, and is grounded through electrical connection.

There is a relatively heavy component among precise electronic components that are mounted on such a socket for electronic components. When the socket for electronic components receives vibration or an impact while a heavy component is mounted on the socket for electronic components, great stress is applied to a soldered portion on which soldering has been performed for grounding. For this reason, there is a concern that the soldered portion may be damaged. As a method of absorbing vibration or an impact, there is a method of absorbing vibration or an impact by the contact portion 903*d* that is curved so as to have elasticity. However, when the contact portion 903*d* is formed to be curved in the socket 900 for electronic components disclosed in Japanese Unexamined Patent Application Publication No. 2013-258131, soldering for grounding cannot be performed. For this reason, there is a problem in that shield performance deteriorates. Further, since the contact portion loses elasticity even if soldering is performed on the contact portion 903*d* formed to be curved, there is a problem in that the contact portion cannot absorb vibration or an impact.

These and other drawbacks exist.

SUMMARY OF THE DISCLOSURE

Embodiments of the disclosure provide a socket for electronic components which can absorb an impact and of which shield performance can be improved.

According to an example embodiment, a socket for electronic components includes: a case through which a plurality of through holes of which inner wall surfaces have conductivity in a vertical direction are formed so as to pass in the vertical direction; and a ground contact unit that is disposed in at least one of the plurality of through holes, electrically connects an electronic component-side contact portion of an electronic component to a substrate-side contact portion of a substrate, and is electrically connected to an inner wall surface of the through hole at upper and lower portions of the through hole. The ground contact unit includes a holding member that is held in the through hole, and a conductive member that is held by the holding member. The conductive member has elasticity, and includes an intermediate portion that is held by the holding member, an upper extension portion that extends upward from the intermediate portion, and a lower extension portion that extends downward from the intermediate portion. The lower extension portion includes a ground extension portion that comes into elastic contact with the inner wall surface of the through hole so as to be slidable on the inner wall surface of the through hole, a fixed portion that is fixed to the substrate-side contact portion, and an impact absorbing portion that is formed between the fixed portion and the intermediate portion so as to be curved.

Accordingly, since the lower extension portion includes the impact absorbing portion formed so as to be curved and the ground extension portion comes into elastic contact with the inner wall surface of the through hole so as to be slidable on the inner wall surface of the through hole, the impact absorbing portion absorbs an impact by being bent as when the socket for electronic components receives an impact and the ground extension portion maintains electrical connection by sliding on the inner wall surface of the through hole along the inner wall surface of the through hole. Accordingly, an impact can be absorbed and shield performance can be improved.

Further, in a socket for electronic components according to an example embodiment, the ground extension portion extends so as to face the inner wall surface of the through hole from a position different from a position where the fixed portion is connected to the impact absorbing portion.

Accordingly, since the ground extension portion extends from a position different from a position where the fixed portion is connected to the impact absorbing portion, constraints on the widths of the ground extension portion and the impact absorbing portion and the like are reduced. Therefore, the ground extension portion and the impact absorbing portion can sufficiently function.

Furthermore, in a socket for electronic components according to an example embodiment, one direction orthogonal to the vertical direction is defined as the lateral direction, and the ground extension portion includes the first and second ground extension portions extending so as to face a pair of inner wall surfaces of the through hole, which are provided so as to face each other in the lateral direction, respectively. The first and second ground extension portions come into elastic contact with the inner wall surfaces of the through hole in opposite directions.

Accordingly, the ground extension portion includes the first ground extension portion that extends so as to face one of the inner wall surfaces of the through hole facing each other in the lateral direction, and the second ground extension portion that extends so as to face the other inner wall surface. Since the first and second ground extension portions come into elastic contact with the inner wall surfaces of the through hole in opposite directions, an impact can be absorbed by the first and second ground extension portions when an impact is applied in the lateral direction. Accordingly, the deformation of the impact absorbing portion and the inclination of the fixed portion, which are caused by an impact applied in the lateral direction, can be prevented.

Moreover, in the socket for electronic components according to an example embodiment, a direction orthogonal to the vertical direction and the lateral direction is defined as the longitudinal direction, the first ground extension portion extends in the longitudinal direction along the inner wall surface of the through hole and the second ground extension portion extends in the longitudinal direction along the inner wall surface of the through hole, and the holding member is fixed in the through hole so that one end of the first ground extension portion in the longitudinal direction and the other end of the second ground extension portion in the longitudinal direction come into pressure contact with the inner wall surface of the through hole.

Accordingly, the first and second ground extension portions come into contact with the inner wall surface of the through hole at a part of the first and second ground extension portions. Since the first and second ground extension portions come into contact with the inner wall surface of the through hole as described above, a pressure contact force per unit area can be increased in comparison with a case in which the entire surfaces of the first and second ground extension portions facing the inner wall surface of the through hole come into contact with the inner wall surface of the through hole. Accordingly, even though an elastic contact force is small, the reliability of the contact between the first and second ground extension portions and the through hole can be improved.

BRIEF DESCRIPTION OF THE DRAWINGS

FIGS. 2A and 2B are views showing a case 1 of the first embodiment, in which FIG. 2A is a perspective view showing an example of the appearance of the case 1 and FIG. 2B is an enlarged plan view of a portion A of FIG. 2A;

FIGS. 3A and 3B are views showing a holding member 2 with which a conductive member 3 of an example embodiment is formed integrally, in which FIG. 3A is a perspective view showing the appearance of the holding member 2 and FIG. 3B is a perspective view showing the appearance of the holding member 2 as seen from an X2-direction side shown in FIG. 3A;

FIGS. 4A and 4B are views showing the holding member 2 with which the conductive member 3 of the first embodiment is formed integrally, in which FIG. 4A is a plan view showing the appearance of the holding member 2 as seen from a Z1-direction side shown in FIG. 3A and FIG. 4B is a plan view showing the appearance of the holding member 2 as seen from a Z2-direction side shown in FIG. 3A;

FIGS. 5A and 5B are views showing the conductive member 3 of the first embodiment, in which FIG. 5A is a perspective view showing the appearance of the conductive member 3 and FIG. 5B is a perspective view showing the appearance of the conductive member 3 as seen from a Y1-direction side shown in FIG. 5A;

FIGS. 6A and 6B are views showing a moving member 4 of the first embodiment, in which FIG. 6A is a perspective view showing the appearance of the moving member 4 that is used for conduction and FIG. 6B is a perspective view showing the appearance of the moving member 4 that is used for grounding;

FIGS. 7A and 7B are views showing the moving member 4 of an example embodiment, in which FIG. 7A is a side view showing the appearance of the moving member 4 as seen from a Y2-direction side shown in FIG. 6A and FIG. 7B is a plan view showing the appearance of the moving member 4 as seen from a Z2-direction side shown in FIG. 6A;

FIG. 9 shows a state seen from a Z2-direction side shown in FIG. 8;

FIGS. 11A and 11B are views illustrating a method of inserting the moving member 4 of an example embodiment into the through hole 1*a*, in which FIG. 11A is a plan view showing the moving member 4 at the time of the start of insertion and FIG. 11B is a plan view showing the moving member 4 after insertion. Meanwhile, the shape of an opening of the through hole 1*a* is shown in FIGS. 11A and 11B as a simple shape;

FIGS. 12A and 12B are views showing the bending of an impact absorbing portion 3*f* and the sliding of a ground extension portion 3*d* when the socket 100 for electronic components according to an example embodiment receives an impact, in which FIG. 12A is a schematic side view showing the bending of the impact absorbing portion 3*f* and FIG. 12B is a schematic side view showing the bending of the impact absorbing portion 3*f* and the sliding of the ground extension portion 3*d*. Meanwhile, a bent state and a sliding state are schematically shown in FIGS. 12A and 12B by a broken line. Further, a first ground extension portion 3*g* is not shown in FIG. 12A; and FIGS. 13A to 13D are views showing a socket 900 for electronic components disclosed in Japanese Unexamined Patent Application Publication No. 2013-258131, in which FIG. 13A is a perspective view showing the appearance of the socket 900 for electronic components, FIG. 13B is a schematic view showing the socket 900 for electronic components in an initial state, FIG. 13C is a schematic view showing the socket 900 for electronic components in a state in which a moving member 902 is pressed by an electrode terminal TEM, and FIG. 13D is a plan view showing the movement of the moving member 902 when the moving member 902 is pressed by the electrode terminal TEM.

DETAILED DESCRIPTION OF THE DISCLOSURE

The following description is intended to convey a thorough understanding of the embodiments described by providing a number of specific embodiments and details involving a socket for electronic components apparatus. It should be appreciated, however, that the present invention is not limited to these specific embodiments and details, which are exemplary only. It is further understood that one possessing ordinary skill in the art, in light of known systems and methods, would appreciate the use of the invention for its intended purposes and benefits in any number of alternative embodiments, depending on specific design and other needs.

Figure 1:
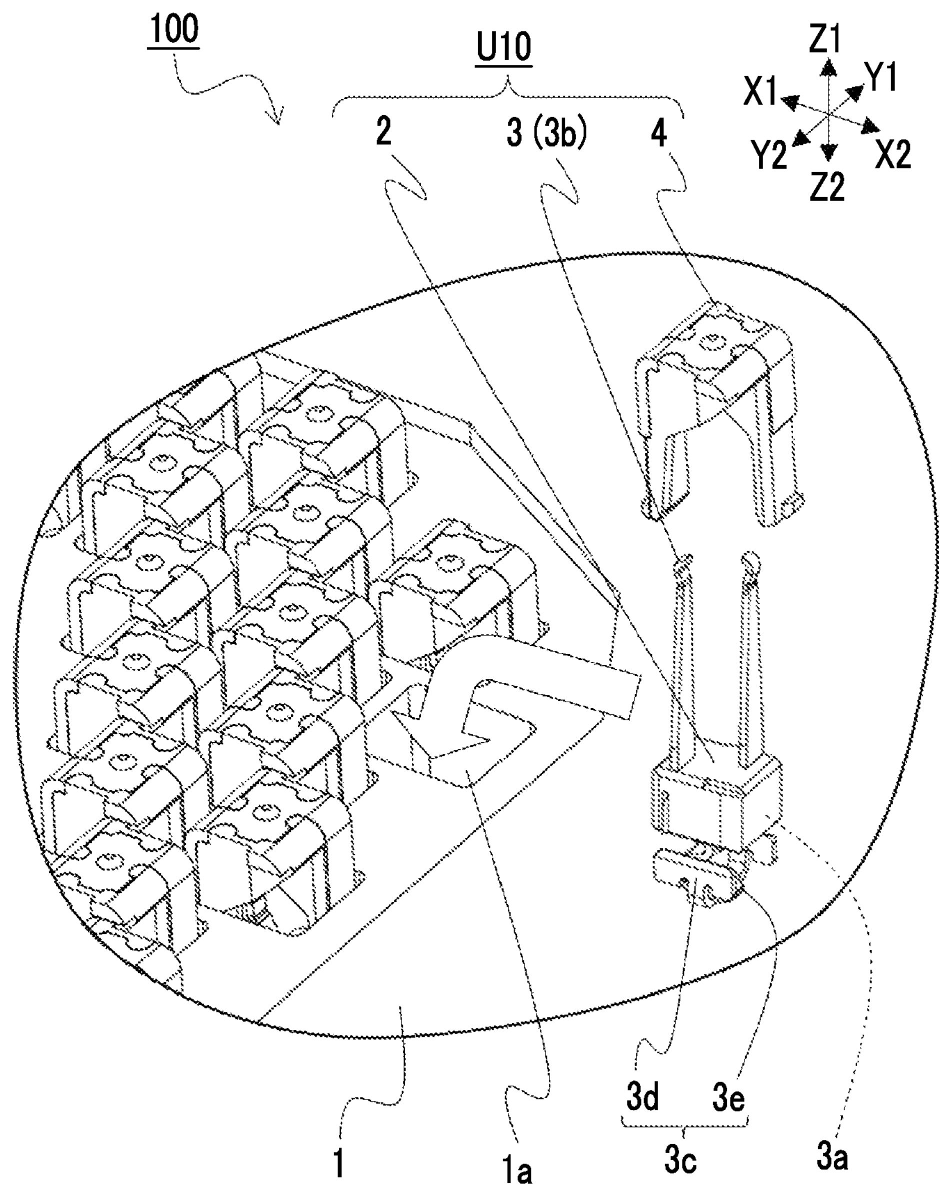
FIG. 1 is an exploded perspective view showing the structure of a socket 100 for electronic components according to an example embodiment of the disclosure.
Figure 2A:
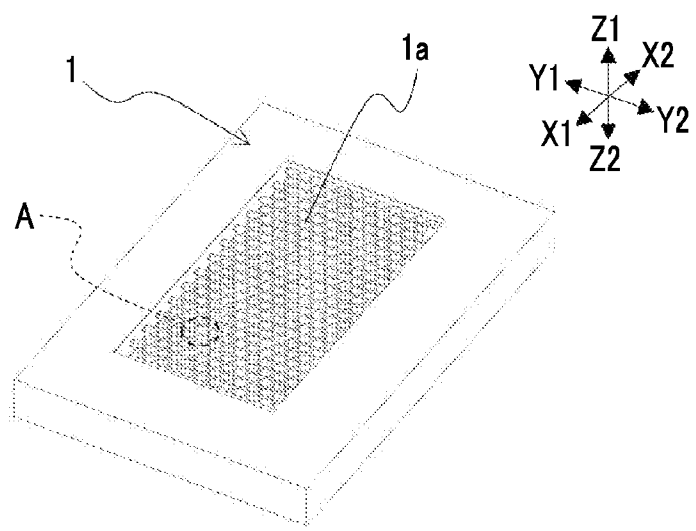
Figure 2B:
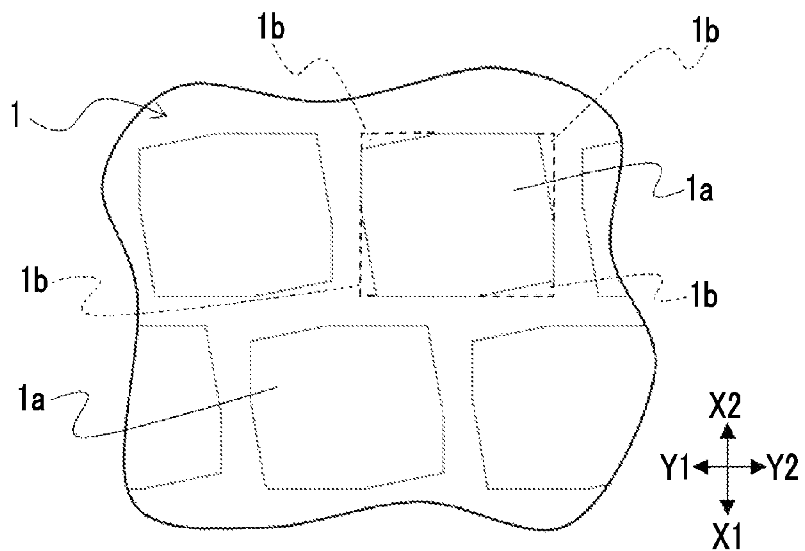
Figure 3A:
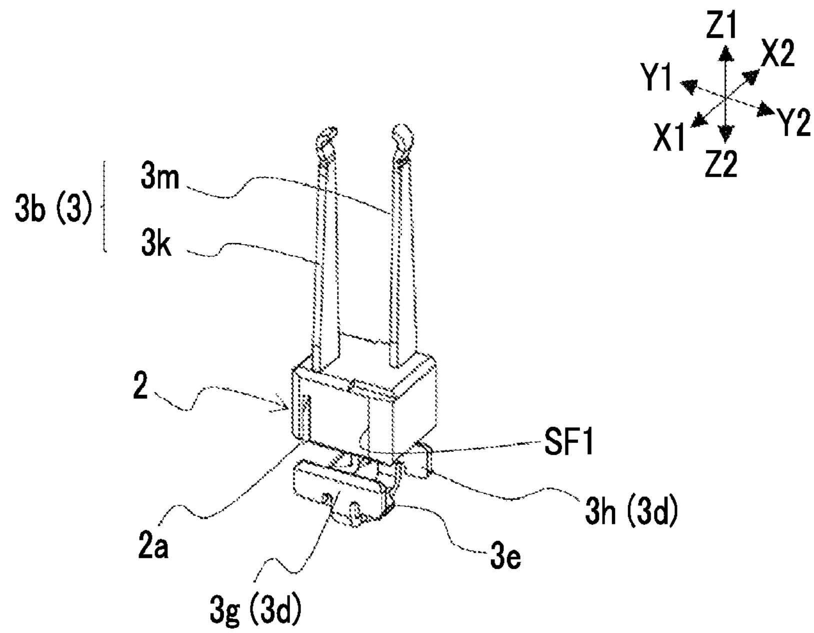
Figure 3B:
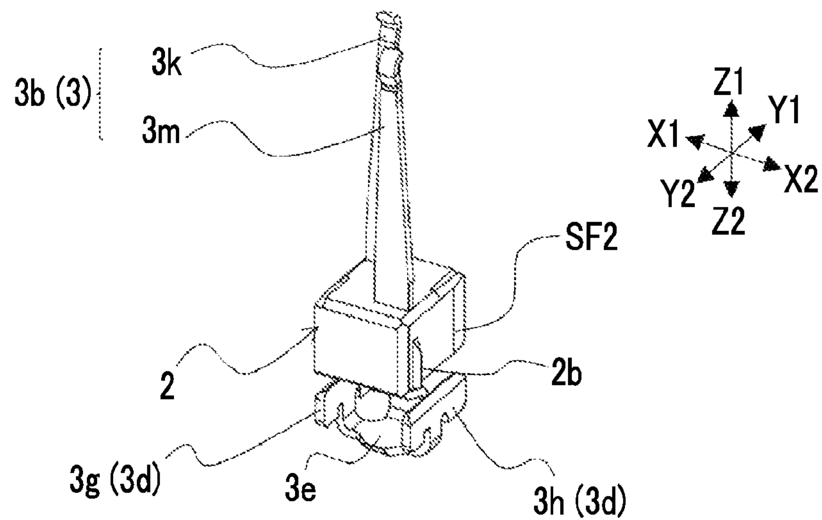
Figure 4A:
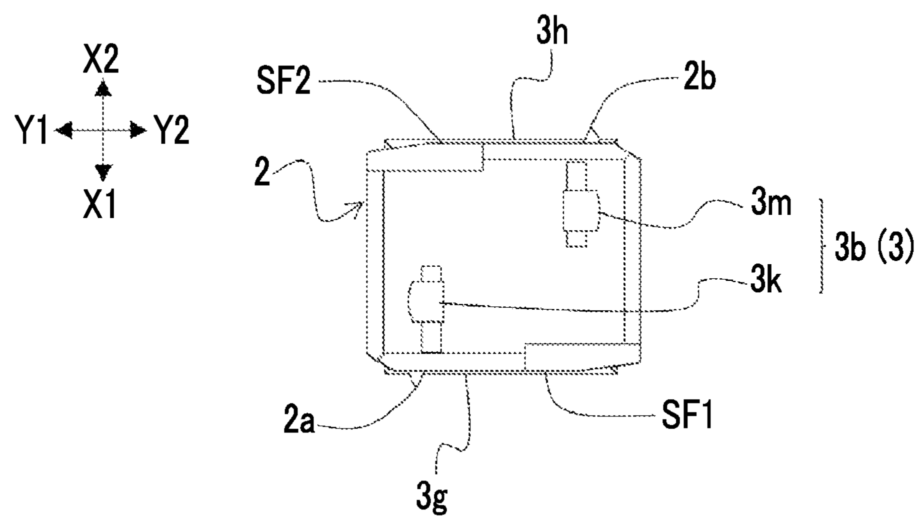
Figure 4B:
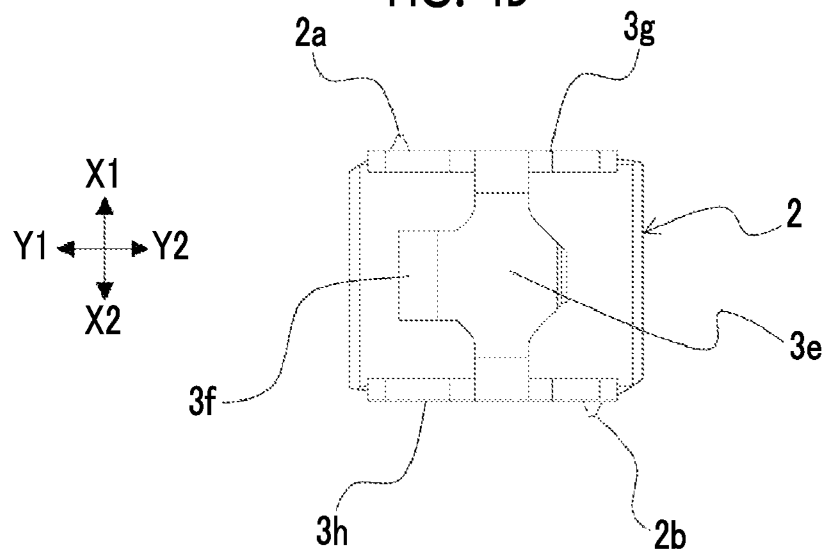
Figure 5A:
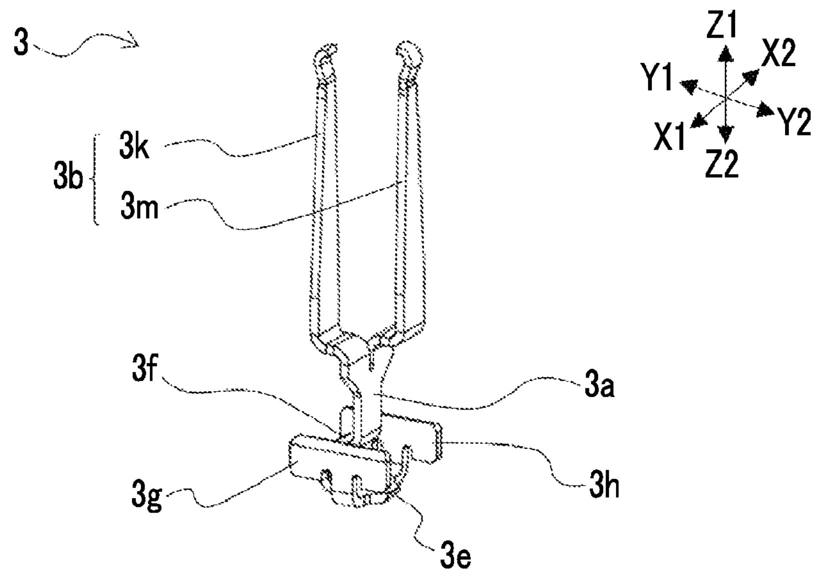
Figure 5B:
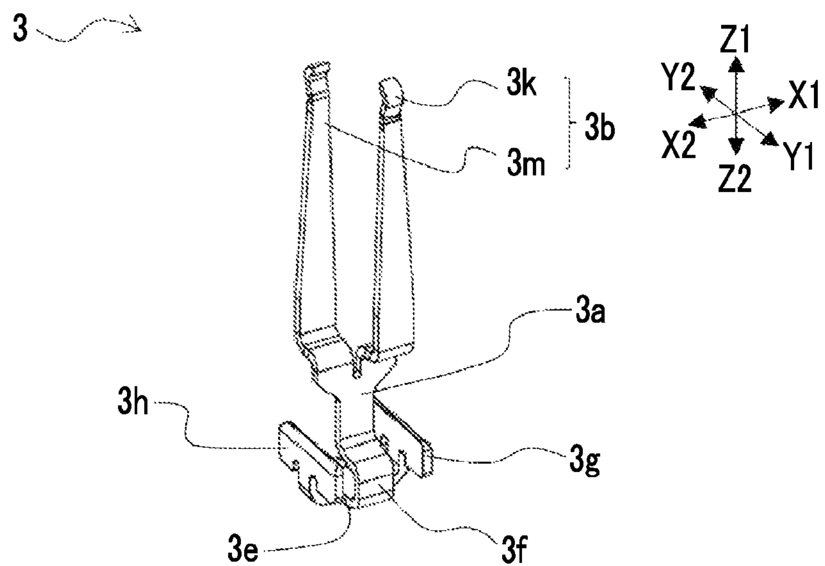
Figure 6A:
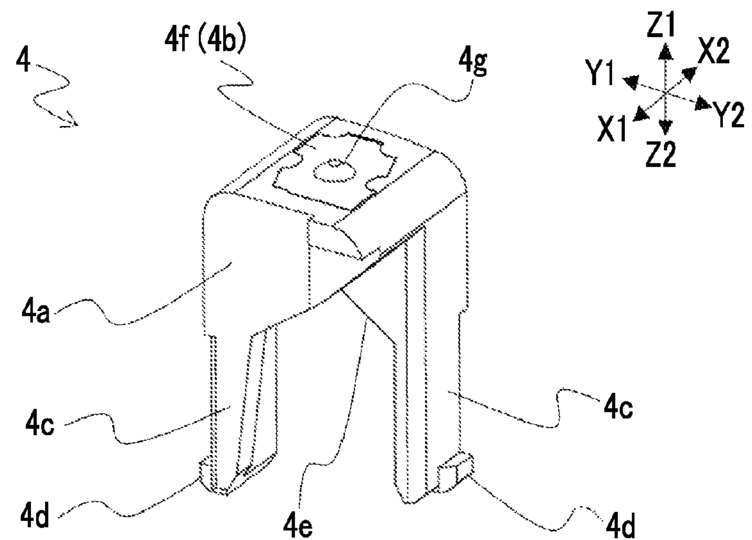
Figure 6B:
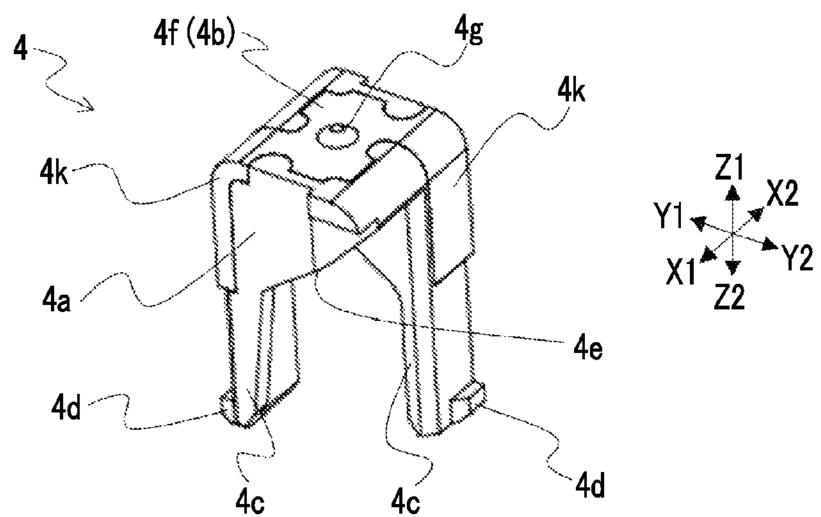
Figure 7A:
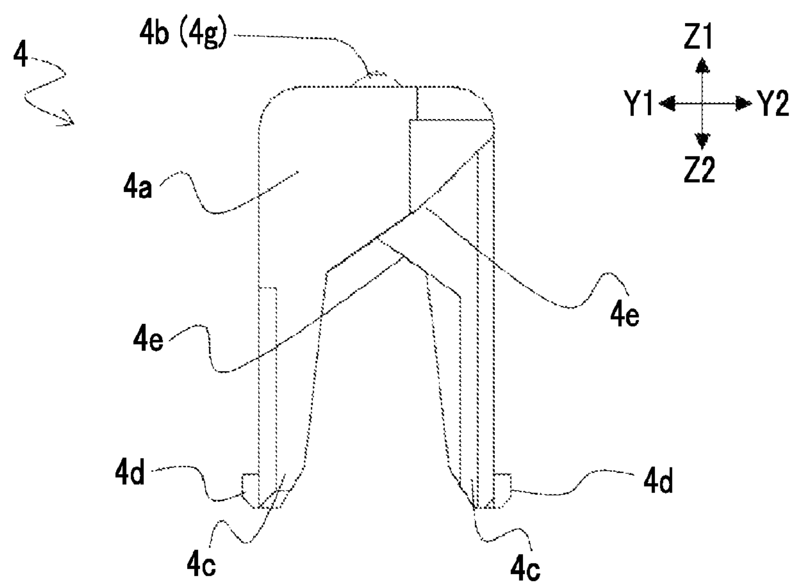
Figure 7B:
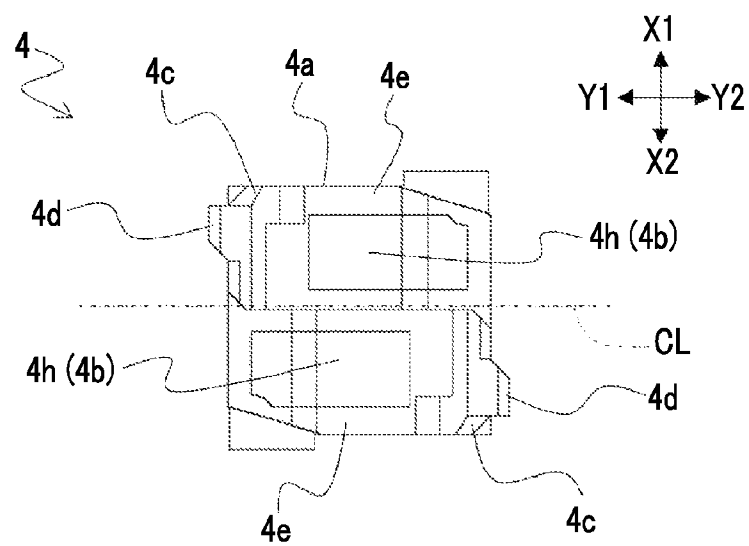

FIG. 1 is an exploded perspective view showing the structure of the socket 100 for electronic components according to an example embodiment. FIGS. 2A and 2B are views showing a case 1 of the example embodiment, in which FIG. 2A is a perspective view showing an example of the appearance of the case 1 and FIG. 2B is an enlarged plan view of a portion A of FIG. 2A. FIGS. 3A and 3B are views showing a holding member 2 with which a conductive member 3 of the example embodiment is formed integrally, in which FIG. 3A is a perspective view showing the appearance of the holding member 2 and FIG. 3B is a perspective view showing the appearance of the holding member 2 as seen from an X2-direction side shown in FIG. 3A. FIGS. 4A and 4B are views showing the holding member 2 with which the conductive member 3 of the example embodiment is formed integrally, in which FIG. 4A is a plan view showing the appearance of the holding member 2 as seen from a Z1-direction side shown in FIG. 3A and FIG. 4B is a plan view showing the appearance of the holding member 2 as seen from a Z2-direction side shown in FIG. 3A. FIGS. 5A and 5B are views showing the conductive member 3 of the first embodiment, in which FIG. 5A is a perspective view showing the appearance of the conductive member 3 and FIG. 5B is a perspective view showing the appearance of the conductive member 3 as seen from a Y1-direction side shown in FIG. 5A. FIGS. 6A and 6B are views showing a moving member 4 of the example embodiment, in which FIG. 6A is a perspective view showing the appearance of the moving member 4 that is used for conduction and FIG. 6B is a perspective view showing the appearance of the moving member 4 that is used for grounding. FIGS. 7A and 7B are views showing the moving member 4 of the example embodiment, in which FIG. 7A is a side view showing the appearance of the moving member 4 as seen from a Y2-direction side shown in FIG. 6A and FIG. 7B is a plan view showing the appearance of the moving member 4 as seen from a Z2-direction side shown in FIG. 6A.

As shown in FIG. 1, the socket 100 for electronic components according to an example embodiment includes a ground contact unit U10 or a conduction contact unit U30 may include a case 1, a holding member 2, a conductive member 3, and a moving member 4. Meanwhile, the ground contact unit U10 may be used for grounding, and the conduction contact unit U30 may be used for usual conduction.

A case 1 may be a resin molding of which the surface is covered with a conductive material. For example, the case 1 may be formed in a rectangular parallelepiped shape as shown in FIGS. 2A and 2B. A plurality of through holes 1*a*, which pass through the case 1 in a vertical direction (Z1-Z2 direction) and of which inner wall surfaces have conductivity in the vertical direction, may be formed in the case 1. Meanwhile, plating may be performed on the entire case 1 so that the inner wall surfaces of the through holes 1*a* have conductivity. Further, the shape of an upper opening of the through hole 1*a* may be a hexagonal shape in which four corners of a rectangular shape are moved to the inside of the through hole 1*a* as shown in FIG. 2B. Furthermore, when a portion of the through hole 1*a*, which is moved to the inside of the through hole, is referred to as a hook portion 1*b*, a space may be s formed on the lower side of the hook portion 1*b* (Z2-direction side) and the opening face of the through hole 1*a* on the lower side is formed to be larger than that on the upper side. Meanwhile, the case 1 may be formed as a metal plate assembly in which a plurality of metal plates having conductivity are combined to form through holes 1*a*.

The holding member 2 may be made of a synthetic resin material, and may be formed in a rectangular parallelepiped shape so as to be large enough to be inserted into the through hole 1*a* of the case 1 as shown in FIGS. 3A and 3B. The holding member 2 may include a first protruding portion 2*a* formed on a first side surface SF1 (X1-direction side), and a second protruding portion 2*b* formed on a second side surface SF2 (X2-direction side) that is the back of the first side surface SF1. Each of the first and second protruding portions 2*a* and 2*b* may be formed in the shape of a rib extending in the vertical direction (Z1-Z2 direction), and the holding member 2 may include one first protruding portion 2*a* and one second protruding portion 2*b*. Meanwhile, when one direction orthogonal to the vertical direction, that is, an X1-X2 direction, is defined as a lateral direction and a direction orthogonal to the vertical direction and the lateral direction, that is, a Y1-Y2 direction, is defined as a longitudinal direction in the first embodiment, the first protruding portion 2*a* is provided on the first side surface SF1 on one side in the longitudinal direction (Y2-direction side) and the second protruding portion 2*b* is provided on the second side surface SF2 on the other side in the longitudinal direction (Y1-direction side).

The conductive member 3 may be formed of a metal plate having elasticity and conductivity. As shown in FIGS. 3A to 4B, the conductive member 3 may be integrally held on the holding member 2 by insert molding. Further, as shown in FIGS. 5A and 5B, the conductive member 3 may include an intermediate portion 3*a* that may be held by the holding member 2, an upper extension portion 3*b* that may extend upward from the intermediate portion 3*a*, and a lower extension portion 3*c* that extends downward from the intermediate portion 3*a*. The intermediate portion 3*a* is formed in the shape of a flat plate. In FIGS. 4A and 4B, the upper extension portion 3*b* may be divided into two pieces at an upper end of the intermediate portion 3*a* in the X1-X2 direction. A root portion of the upper extension portion 3*b* (first upper extension portion 3*k*) disposed on the X1-direction side is bent toward the Y1-direction side and then extends upward. Further, a root portion of the upper extension portion 3*b* (second upper extension portion 3*m*) disposed on the X2-direction side is bent toward the Y2-direction side and then extends upward. An upper end portion of each upper extension portion 3*b* is curved so as to forma curved surface. The lower extension portion 3*c* may include a ground extension portion 3*d*, a fixed portion 3*e*, and an impact absorbing portion 3*f* that may be formed between the fixed portion 3*e* and the intermediate portion 3*a* so as to be curved. As shown in FIG. 4B, the ground extension portion 3*d* may extend from a position different from a position where the fixed portion 3*e* is connected to the impact absorbing portion 3*f*. Meanwhile, in an example embodiment, the ground extension portion 3*d* may include a first ground extension portion 3*g* and a second ground extension portion 3*h*. The first and second ground extension portions 3*g* and 3*h* may extend in directions facing each other in the lateral direction (X1-X2 direction) that is a direction crossing (orthogonal to) a direction in which a position where the fixed portion 3*e* is connected to the impact absorbing portion 3*f* is present. Meanwhile, the first ground extension portion 3*g* may extend in an X1 direction, and the second ground extension portion 3*h* may extend in an X2 direction. An end portion, which may extend in the X1 direction, of the first ground extension portion 3*g* may be bent upward and extends in the longitudinal direction (Y1-Y2 direction). Further, an end portion, which may extend in the X2 direction, of the second ground extension portion 3*h* may be bent upward and extends in the longitudinal direction (Y1-Y2 direction).

There are two kinds of moving members 4, that is, a moving member 4 used for the ground contact unit U10 and a moving member 4 used for the conduction contact unit U30. First, the moving member used for the conduction contact unit U30 will be described. As shown in FIGS. 6A and 6B, the moving member 4 may be formed in a substantially rectangular parallelepiped shape. The moving member 4 may include a pedestal part 4*a* that is made of a synthetic resin material and formed in a substantially rectangular parallelepiped shape, and a conduction member 4*b* that may be formed of a metal plate and is insert-molded into the pedestal part 4*a*. Here, a bisector of the pedestal part 4*a* in a plan view of the pedestal part 4*a* seen from above is defined as a center line CL. Meanwhile, in an example embodiment, a bisector of the pedestal part 4*a* orthogonal to the X1-X2 direction is defined as the center line CL as shown in FIGS. 7A and 7B. The pedestal part 4*a* may include legs 4*c* extending downward from the lower surface thereof (the surface thereof positioned on the Z2-direction side) at positions that correspond to a pair of corners disposed diagonally in a plan view of the pedestal part 4*a* seen from above, that is, a corner disposed on the X1-direction side and the Y2-direction side and a corner disposed on the X2-direction side and the Y1-direction side in the first embodiment. Each of the legs 4*c* may be formed in the shape of a plate that extends to the center line CL from each of the pair of corners disposed diagonally, and a protrusion 4*d*, which may protrude outward (in the X1 or X2 direction), is formed at the end portion of each leg. Further, the pedestal part 4*a* may include inclined surface portions 4*e* that are inclined upward from root positions of the legs 4*c*. Meanwhile, the inclined surface portion 4*e* may be positioned on one side of the center line CL, and is formed so as to be inclined upward of a side where the leg 4*c* is not formed. That is, one inclined surface portion 4*e* may be formed so as to be inclined upward from the root position of the leg 4*c*, which may be formed on the X1-direction side and the Y2-direction side, toward a position that is resent on the X2-direction side and the Y2-direction side. The other inclined surface portion 4*e* may be formed so as to be inclined upward from the root position of the leg 4*c*, which is formed on the X2-direction side and the Y1-direction side, toward a position that is resent on the X1-direction side and the Y1-direction side. As shown in FIGS. 6A and 6B, a part of a connecting portion 4*h* may be exposed to the upper surface of the pedestal part 4*a* and the connecting portion 4*h* forms a contact portion 4*f*. A protruding portion 4*g*, which protrudes upward, may be formed at the center position of the contact portion 4*f*. Further, as shown in FIGS. 7A and 7B, a part of the connecting portion 4*h* may be exposed to the inclined surface portion 4*e* and forms the connecting portion 4*h* that extends along the inclined surface portion 4*e*. Meanwhile, the contact portion 4*f* and the connecting portion 4*h* may be electrically connected to each other. As shown in FIG. 6B, a part of the contact portion 4*f* of the moving member 4 used for the ground contact unit U10 may extend toward the leg 4*c* from the upper surface of the pedestal part 4*a* along the side surface of the pedestal part 4*a*, so that a ground contact portion 4*k* is formed.

When the moving member 4 is disposed and stacked on the holding member 2 formed integrally with the conductive member 3 so as to come into contact with the conductive member 3, the ground contact unit U10 and the conduction contact unit U30 may be formed.

Figure 8:
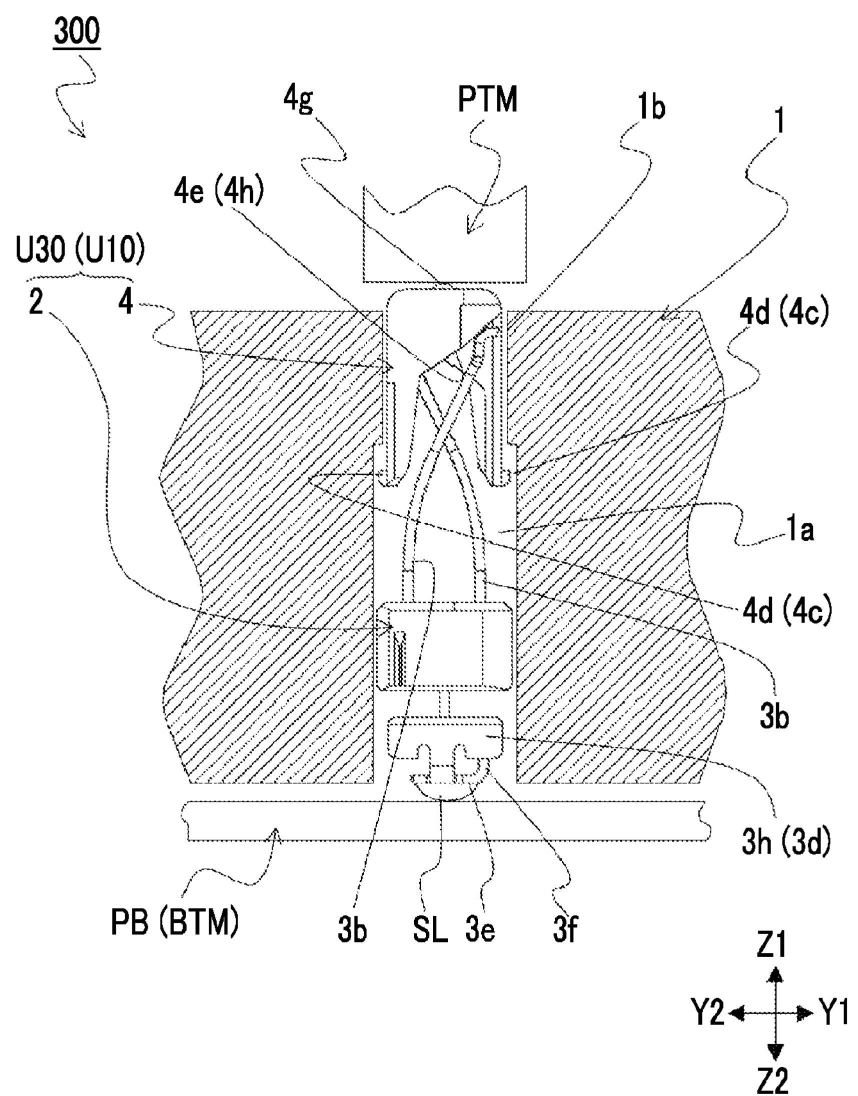
FIG. 8 is a schematic cross-sectional view showing the structure of the socket 100 for electronic components according to an example embodiment. Meanwhile, only one through hole 1*a* is shown in FIG. 8 for the purpose of simple illustration.
Figure 9:
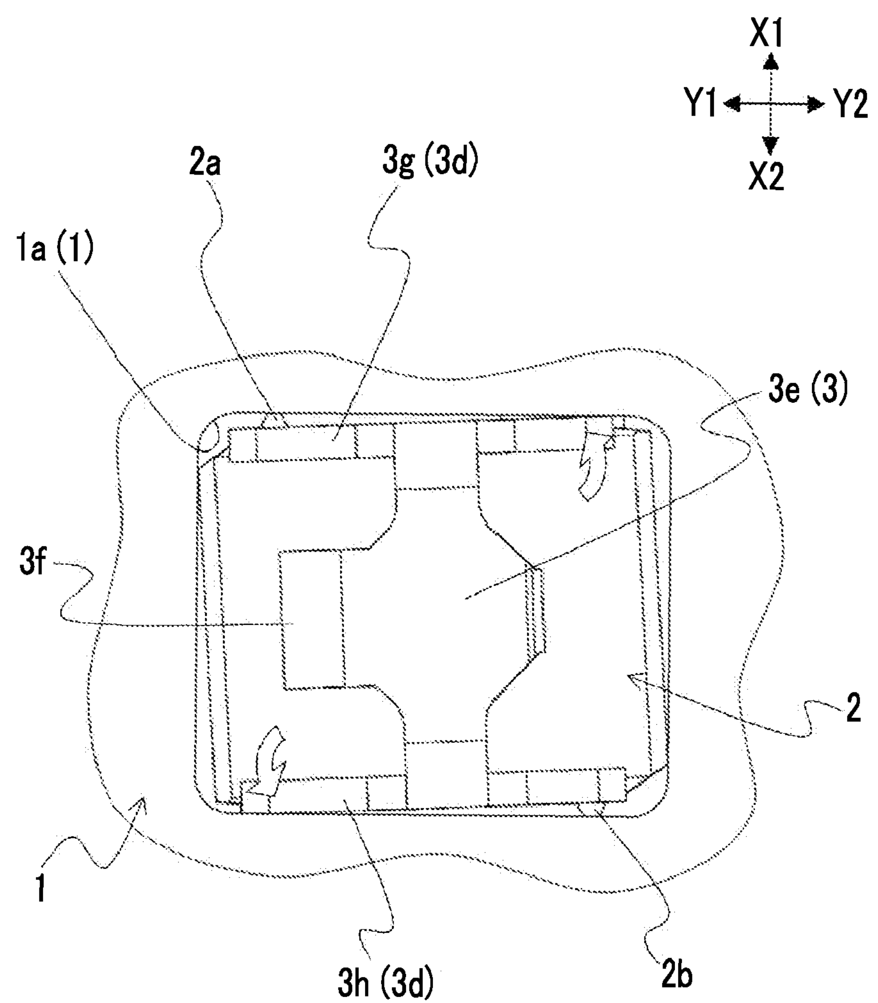
FIG. 9 is a plan view showing a state in which the holding member 2 of an example embodiment is held in the through hole 1*a*. Meanwhile.
Figure 10:
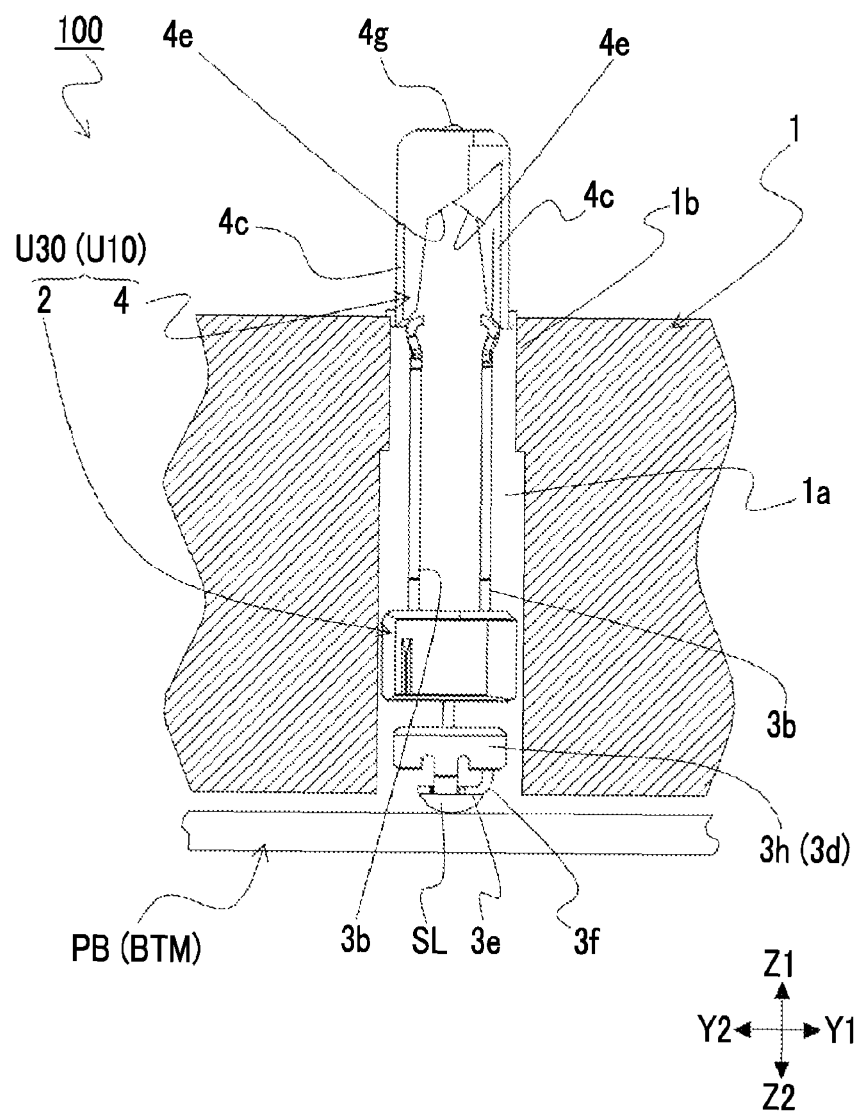
FIG. 10 is a schematic cross-sectional view showing a state in which the moving member 4 of an example embodiment is not yet inserted into the through hole 1*a*.
Figure 11A:
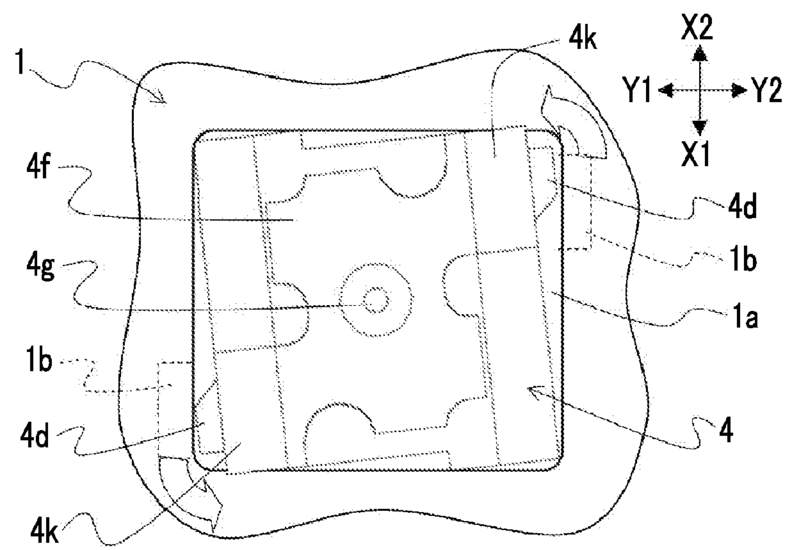
Figure 11B:
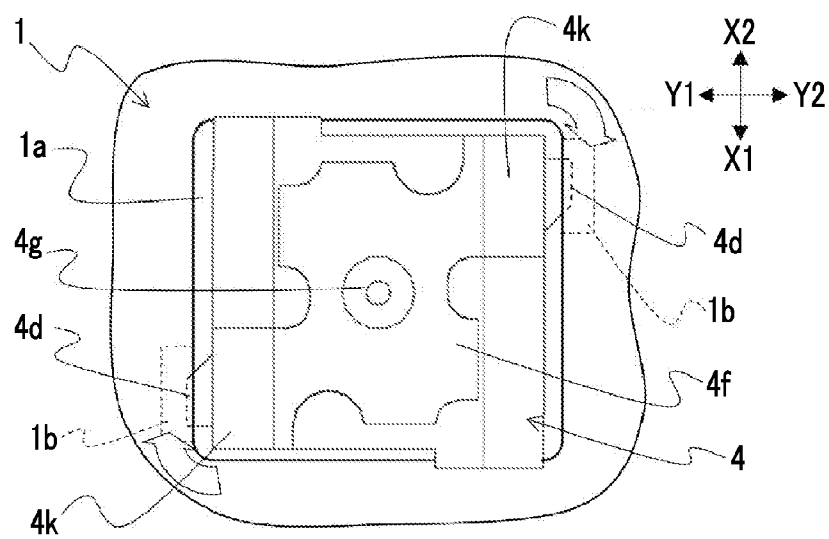

Next, the structure of the socket 100 for electronic components will be described with reference to FIGS. 2A and 2B and FIGS. 8 to 11B. FIG. 8 is a schematic cross-sectional view showing the structure of the socket 100 for electronic components according to the first embodiment. Meanwhile, only one through hole 1*a* is shown in FIG. 8 for the purpose of simple illustration. FIG. 9 is a plan view showing a state in which the holding member 2 of an example embodiment is held in the through hole 1*a*. Meanwhile, FIG. 9 shows a state seen from the Z2-direction side shown in FIG. 10. FIG. 10 is a schematic cross-sectional view showing a state in which the moving member 4 of the first embodiment is not yet inserted into the through hole 1*a*. FIGS. 11A and 11B are views illustrating a method of inserting the moving member 4 of an example embodiment into the through hole 1*a*, in which FIG. 11A is a plan view showing the moving member 4 at the time of the start of insertion and FIG. 11B is a plan view showing the moving member 4 after insertion. Meanwhile, the shape of the opening of the through hole 1*a* is shown in FIGS. 11A and 11B as a simple shape.

When the socket 100 for electronic components is used as a conduction terminal, the conduction contact unit U30 may be disposed in the through hole 1*a* of the case 1 so that a conduction moving member 4 may protrude upward from the through hole 1*a* as shown in FIG. 8. Further, when the socket 100 for electronic components is used as a ground terminal, the ground contact unit U10 may be disposed in at least one through hole 1*a* of the case 1 so that a ground moving member 4 protrudes upward from the through hole 1*a*. Meanwhile, the holding member 2, which may be formed integrally with the conductive member 3, of each of the ground contact unit U10 and the conduction contact unit U30 may be inserted into the through hole 1*a* from the lower side and the moving member 4 thereof may be inserted into the through hole 1*a* from the upper side.

Since the ground contact unit U10 and the conduction contact unit U30 may be disposed in the through hole 1*a* as described above, the ground extension portion 3*d* (the first and second ground extension portions 3*g* and 3*h*) may extend toward a pair of inner wall surfaces of the through hole 1*a* that are formed so as to face each other in the lateral direction (X1-X2 direction) as shown in FIG. 9. Further, the first ground extension portion 3*g* extends in the longitudinal direction (Y1-Y2 direction) along the inner wall surface of the through hole 1*a*, and the second ground extension portion 3*h* extends in the longitudinal direction along the inner wall surface of the through hole 1*a*. The ground extension portion 3*d*, which may be disposed as described above, comes into elastic contact with the inner wall surface of the through hole 1*a* so as to be slidable on the inner wall surface of the through hole 1*a*. Meanwhile, the holding member 2 inserted into the through hole 1*a* may be inserted (press-fitted) into the through hole 1*a* so that the first and second protruding portions 2*a* and 2*b* come into contact with the inner wall surfaces of the through hole 1*a* and the holding member 2 rotates about a virtual axis parallel to the vertical direction (the Z1-Z2 direction shown in FIG. 8); and may be fixed in the through hole 1*a*. Since the holding member 2 may be inserted into the through hole 1*a* so as to rotate as described above, the lower extension portion 3*c* of the conductive member 3 may be disposed in the through hole 1*a* so as to be twisted relative to the holding member 2. Accordingly, one end of the first ground extension portion 3*g* in the longitudinal direction (an end portion of the first ground extension portion 3*g* on the Y2-direction side) and the other end of the second ground extension portion 3*h* in the longitudinal direction (an end portion of the second ground extension portion 3*h* on the Y1-direction side) come into pressure contact with the inner wall surfaces of the through hole 1*a*.

Further, as shown in FIG. 10, the moving member 4 may be inserted into the through hole 1*a* from the upper side of the through hole 1*a* so that the legs 4*c* face downward, and may be disposed so as to be stacked on the upper extension portion 3*b* of the conductive member 3. The moving member 4 may be inserted until the protrusions 4*d* reach a position where the area of the opening of the through hole 1*a* is increased. Meanwhile, when the moving member 4 may be inserted into the through hole, the moving member 4 may be inserted so as to rotate relative to the through hole 1*a* in a counterclockwise direction as shown in FIGS. 11A and 11B. When the moving member 4 is inserted in this way, the protrusions 4*d* are not caught by the upper opening of the through hole 1*a* and the moving member 4 can be inserted into the through hole 1*a*. Meanwhile, it seems that the legs 4*c* (see FIGS. 6A and 6B) come into contact with the upper opening (Z1-direction side) of the through hole 1*a* in FIGS. 11A and 11B. However, since a part of lower portions of corners of the legs 4*c* are chamfered, the legs 4*c* do not come into contact with the opening of the through hole. Furthermore, while the moving member 4 is inserted into the through hole 1*a*, the first upper extension portion 3*k* and the second upper extension portion 3*m* come into contact with the inclined surface portions 4*e* of the moving member 4 and are bent downward as shown in FIG. 8. Moreover, the first upper extension portion 3*k* and the second upper extension portion 3*m*, which have been bent downward, generate an elastic force for rotating the moving member 4 in a clockwise direction. For this reason, when the insertion of the moving member 4 is stopped (the downward pressing of the moving member is stopped), the first upper extension portion 3*k* and the second upper extension portion 3*m* rotate the moving member 4 in the clockwise direction and push the moving member 4 up. Since the moving member 4 may be pushed up as described above, the protrusions 4*d* can be engaged with stepped portions of the hook portion 1*b* (see FIGS. 2A and 2B). Accordingly, the moving member 4 may be disposed in the through hole 1*a* so that the moving member 4 is movable in the vertical direction without being separated. Meanwhile, since the first upper extension portion 3*k* and the second upper extension portion 3*m* are disposed so as to be slidable on the connecting portions 4*h* of the connecting portion 4*h* (see FIGS. 7A and 7B), the protruding portion 4*g* of the moving member 4 and the fixed portion 3*e* of the conductive member 3 may be electrically connected to each other.

When the socket 100 for electronic components is actually used, the socket 100 for electronic components may be disposed on a substrate PB as shown in FIG. 8 and the fixed portion 3*e* may be connected to a substrate-side contact portion BTM of the substrate PB by solder SL. Further, an electronic component may be disposed on the socket 100 for electronic components. The electronic component presses the moving member 4 down (in the Z2 direction) with an electronic component-side contact portion PTM interposed therebetween. Since the pressed moving member 4 bends the upper extension portion 3*b*, the contact portion 4*f* (protruding portion 4*g*) of the moving member 4 comes into pressure contact with the electronic component-side contact portion PTM of the electronic component. Accordingly, the socket 100 for electronic components electrically connects the electronic component-side contact portion PTM of the electronic component to the substrate-side contact portion BTM of the substrate PB. Furthermore, when the electronic component disposed on the socket 100 for electronic components may be removed, the elastic force of the upper extension portion 3*b* allows the moving member 4 to return to a position where the protrusion 4*d* comes into contact with the hook portion 1*b*.

Moreover, when an electronic component-side contact portion PTM of a corresponding electronic component is a ground terminal, the ground contact unit U10 is disposed in the through hole 1*a*. The ground moving member 4 used for the ground contact unit U10 may include the ground contact portions 4*k*. Since the shape of the opening of the through hole 1*a* is shown in FIG. 11B as a simple shape, the ground contact portions 4*k* do not come into contact with the inner wall surfaces of the through hole 1*a*. However, since hook portions 1*b* are formed at an upper portion of an actual through hole 1*a* as shown in FIG. 2B, the ground contact portions 4*k* come into contact with the hook portions 1*b*. Accordingly, the ground contact unit U10 may be electrically connected to the inner wall surface of the through hole 1*a* at the upper end portion (ground contact portion 4*k*) and the lower end portion (ground extension portion 3*d*) of the through hole 1*a*.

Figure 12A:
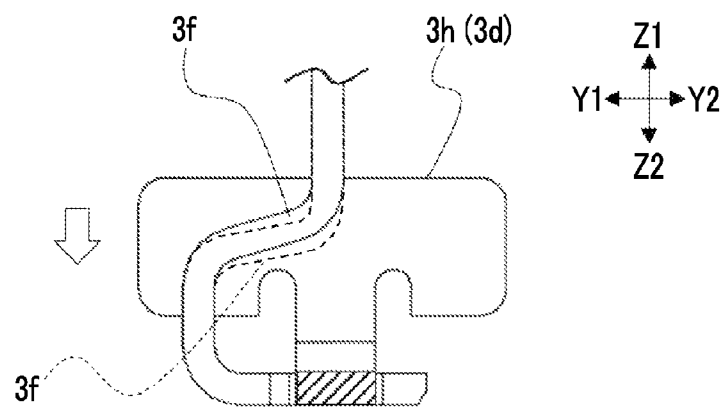
Figure 12B:
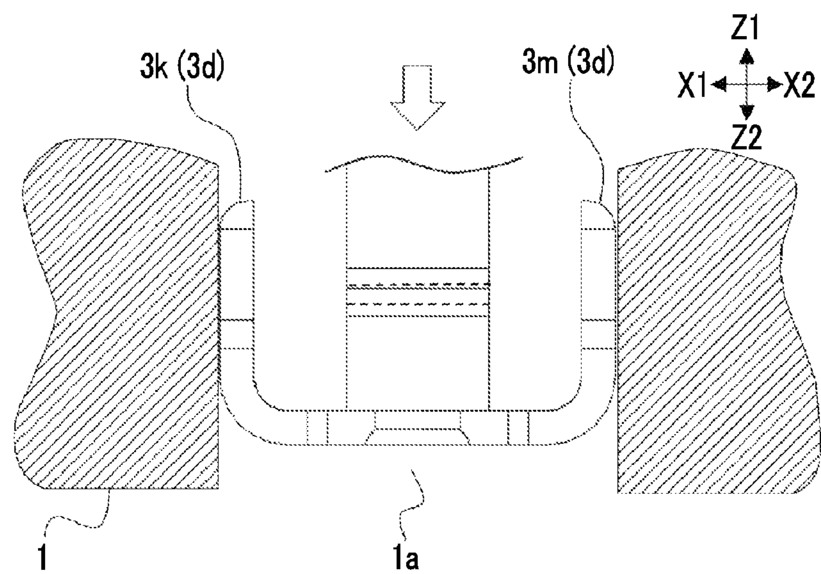
Figure 13A:
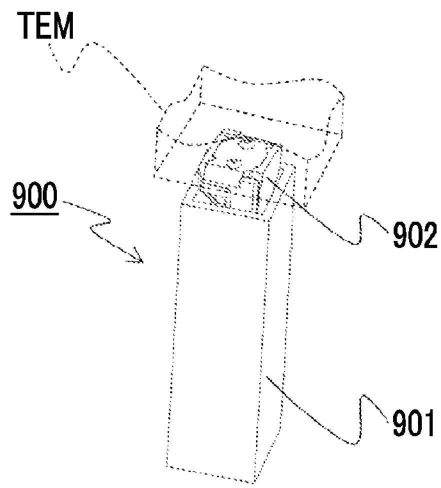
Figure 13D:
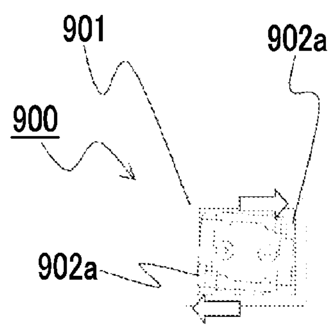
Figure 13B:
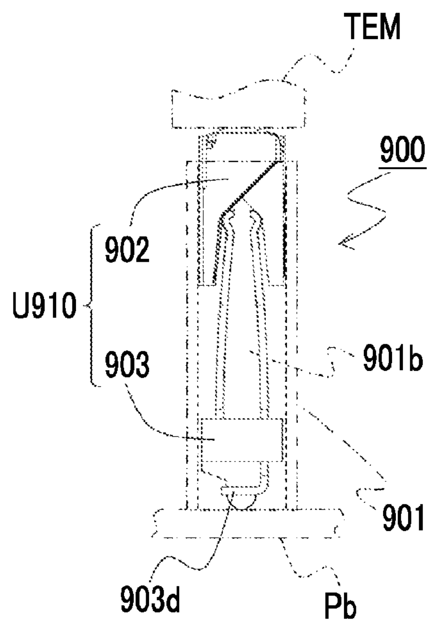
Figure 13C:
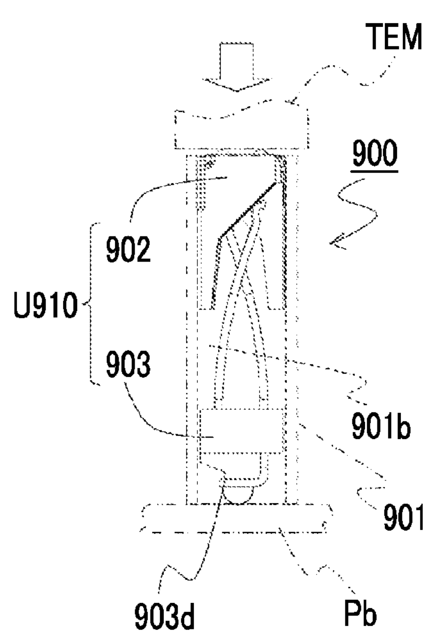

The effects of the example embodiment described herein will be described below. Meanwhile, FIGS. 12A and 12B will be used at a part of description. FIGS. 12A and 12B are views showing the bending of the impact absorbing portion 3*f* and the sliding of the ground extension portion 3*d* when the socket 100 for electronic components according to the an example embodiment receives an impact, in which FIG. 12A is a schematic side view showing the bending of the impact absorbing portion 3*f* and FIG. 12B is a schematic side view showing the bending of the impact absorbing portion 3*f* and the sliding of the ground extension portion 3*d*. Meanwhile, a bent state and a sliding state are schematically shown in FIGS. 12A and 12B by a broken line. Further, the first ground extension portion 3*g* is not shown in FIG. 12A.

The socket 100 for electronic components according to an example embodiment may include: the case 1 through which a plurality of through holes 1*a* of which the inner wall surfaces have conductivity in the vertical direction are formed so as to pass in the vertical direction; and the ground contact unit U10 that is disposed in at least one of the plurality of through holes 1*a*, electrically connects the electronic component-side contact portion PTM of the electronic component to the substrate-side contact portion BTM of the substrate PB, and is electrically connected to the inner wall surface of the through hole 1*a* at the upper and lower portions of the through hole 1*a*. The ground contact unit U10 may include the holding member 2 that may be held in the through hole 1*a*, and the conductive member 3 that may be held by the holding member 2. The conductive member 3 has elasticity, and may include the intermediate portion 3*a* that is held by the holding member 2, the upper extension portion 3*b* that extends upward from the intermediate portion 3*a*, and the lower extension portion 3*c* that extends downward from the intermediate portion 3*a*. The lower extension portion 3*c* may include the ground extension portion 3*d* that comes into elastic contact with the inner wall surface of the through hole 1*a* so as to be slidable on the inner wall surface of the through hole 1*a*, the fixed portion 3*e* that may be fixed to the substrate-side contact portion BTM, and the impact absorbing portion 3*f* that may be formed between the fixed portion 3*e* and the intermediate portion 3*a* so as to be curved.

Accordingly, since the lower extension portion 3*c* includes the impact absorbing portion 3*f* formed so as to be curved and the ground extension portion 3*d* comes into elastic contact with the inner wall surface of the through hole 1*a* so as to be slidable on the inner wall surface of the through hole 1*a*, the impact absorbing portion 3*f* absorbs an impact by being bent as shown in FIGS. 12A and 12B by a broken line, when the socket 100 for electronic components receives an impact and the case 1 vibrates in the vertical direction (Z1-Z2 direction), and the ground extension portion 3*d* maintains electrical connection by sliding on the inner wall surface of the through hole 1*a* along the inner wall surface of the through hole 1*a*. Further, when the case 1 vibrates in the longitudinal direction (X1-X2 direction), the impact absorbing portion 3*f* vibrates in the longitudinal direction and the ground extension portion 3*d* slides on the inner wall surface of the through hole in the longitudinal direction. Accordingly, the impact absorbing portion 3*f* and the ground extension portion 3*d* absorb an impact. Furthermore, when the case 1 vibrates in the lateral direction (Y1-Y2 direction), the impact absorbing portion 3*f* and the ground extension portion 3*d* absorb an impact by oscillating in the lateral direction. Accordingly, an impact can be absorbed and shield performance can be improved.

Moreover, in the socket 100 for electronic components according to the first embodiment, the ground extension portion 3*d* extends so as to face the inner wall surface of the through hole 1*a* from a position different from a position where the fixed portion 3*e* is connected to the impact absorbing portion 3*f*.

Accordingly, since the ground extension portion 3*d* extends from a position different from a position where the fixed portion 3*e* is connected to the impact absorbing portion 3*f*, constraints on the widths of the ground extension portion 3*d* and the impact absorbing portion 3*f* and the like are reduced. Therefore, the ground extension portion 3*d* and the impact absorbing portion 3*f* can sufficiently function.

Further, in the socket 100 for electronic components according to an example embodiment, one direction orthogonal to the vertical direction is defined as the lateral direction, and the ground extension portion 3*d* includes the first and second ground extension portions 3*g* and 3*h* extending so as to face a pair of inner wall surfaces of the through hole 1*a*, which are respectively provided so as to face each other in the lateral direction. The first and second ground extension portions 3*g* and 3*h* come into elastic contact with the inner wall surfaces of the through hole 1*a* in opposite directions.

Accordingly, the ground extension portion 3*d* may include the first ground extension portion 3*g* that extends so as to face one of the inner wall surfaces of the through hole 1*a* facing each other in the lateral direction (the X1-X2 direction shown in FIGS. 12A and 12B), and the second ground extension portion 3*h* that extends so as to face the other inner wall surface. Since the first and second ground extension portions 3*g* and 3*h* come into elastic contact with the inner wall surfaces of the through hole 1*a* in opposite directions, an impact can be absorbed by the first and second ground extension portions 3*g* and 3*h* when an impact is applied in the lateral direction. Accordingly, the deformation of the impact absorbing portion 3*f* and the inclination of the fixed portion, which are caused by an impact applied in the lateral direction, can be prevented.

Further, in the socket 100 for electronic components according to an example embodiment, a direction orthogonal to the vertical direction and the lateral direction is defined as the longitudinal direction, the first ground extension portion 3*g* may extend in the longitudinal direction along the inner wall surface of the through hole 1*a* and the second ground extension portion 3*h* may extend in the longitudinal direction along the inner wall surface of the through hole 1*a*, and the holding member 2 may be fixed in the through hole 1*a* so that one end of the first ground extension portion 3*g* in the longitudinal direction and the other end of the second ground extension portion 3*h* in the longitudinal direction come into pressure contact with the inner wall surface of the through hole 1*a*.

Accordingly, the first and second ground extension portions 3*g* and 3*h* come into contact with the inner wall surface of the through hole 1*a* at a part of the first and second ground extension portions 3*g* and 3*h*. Since the first and second ground extension portions 3*g* and 3*h* come into contact with the inner wall surface of the through hole 1*a* as described above, a pressure contact force per unit area can be increased in comparison with a case in which the entire surfaces of the first and second ground extension portions 3*g* and 3*h* facing the inner wall surface of the through hole 1*a* come into contact with the inner wall surface of the through hole 1*a*. Accordingly, even though an elastic contact force is small, the reliability of the contact between the first and second ground extension portions 3*g* and 3*h* and the through hole 1*a* can be improved.

The socket for electronic components according to the embodiment of the invention has been specifically described above. However, the invention is not limited to the above-mentioned embodiment, and may be modified in various ways without departing from the scope of the invention. For example, the invention may be modified in the following manners and these modifications also belong to the technical scope of the invention.

In an example embodiment, the ground extension portion 3*d* has been formed of the first and second ground extension portions 3*g* and 3*h* that are provided at positions facing each other. However, the positions and sizes of the first and second ground extension portions 3*g* and 3*h* to be formed may be changed so that only one of the first and second ground extension portions 3*g* and 3*h* is formed or a third ground extension portion is provided.

In an example embodiment, the moving member 4 could be inserted through rotation when the moving member 4 is inserted into the through hole 1*a*. However, for example, the legs 4*c* may have elasticity and the moving member 4 may be inserted while the legs 4*c* are bent (spin-in). Meanwhile, in the cases of these structures, the structure of the moving member 4 used for grounding needs to be modified so that the ground contact portion 4*k* is provided so as to protrude to the outside of the moving member 4 and the upper surface of the case 1 and the ground contact portion 4*k* can come into contact with each other.

In an example embodiment, one end of the ground extension portion 3*d* in the longitudinal direction has come into pressure contact with the inner wall surface of the through hole since the holding member 2 is held in the through hole 1*a* while being rotated. For example, the surface of the ground extension portion 3*d* facing the inner wall surface of the through hole 1*a* may be adapted to come into pressure contact with the inner wall surface of the through hole 1*a* even though the holding member 2 is inserted without rotating.

An example of the case 1 has been described above, but the arrangement, the number, and the like of the through holes 1*a* may also be changed according to the electronic component-side contact portion PTM of the electronic component to correspond. Further, the shape and the like of the through hole may also be changed.

It should be understood by those skilled in the art that various modifications, combinations, sub-combinations and alterations may occur depending on design requirements and other factors insofar as they are within the scope of the appended claims of the equivalents thereof.

Accordingly, the embodiments of the present inventions are not to be limited in scope by the specific embodiments described herein. Further, although some of the embodiments of the present disclosure have been described herein in the context of a particular implementation in a particular environment for a particular purpose, those of ordinary skill in the art should recognize that its usefulness is not limited thereto and that the embodiments of the present inventions can be beneficially implemented in any number of environments for any number of purposes. Accordingly, the claims set forth below should be construed in view of the full breadth and spirit of the embodiments of the present inventions as disclosed herein. While the foregoing description includes many details and specificities, it is to be understood that these have been included for purposes of explanation only, and are not to be interpreted as limitations of the invention. Many modifications to the embodiments described above can be made without departing from the spirit and scope of the invention.

What is claimed is:

1. A socket for electronic components comprising:

a case through which a plurality of through holes of which inner wall surfaces have conductivity in a vertical direction are formed so as to pass in the vertical direction; and a ground contact unit that is disposed in at least one of the plurality of through holes, electrically connects an electronic component-side contact portion of an electronic component to a substrate-side contact portion of a substrate, and is electrically connected to an inner wall surface of the through hole at upper and lower portions of the through hole, wherein the ground contact unit includes a holding member that is held in the through hole, and a conductive member that is held by the holding member, the conductive member has elasticity, and includes an intermediate portion that is held by the holding member, an upper extension portion that extends upward from the intermediate portion, and a lower extension portion that extends downward from the intermediate portion, and the lower extension portion includes a ground extension portion that comes into elastic contact with the inner wall surface of the through hole so as to be slidable on the inner wall surface of the through hole, a fixed portion that is fixed to the substrate-side contact portion, and an impact absorbing portion that is formed between the fixed portion and the intermediate portion so as to be curved.

2. The socket for electronic components according to claim 1, wherein the ground extension portion extends so as to face the inner wall surface of the through hole from a position different from a position where the fixed portion is connected to the impact absorbing portion.

3. The socket for electronic components according to claim 1, wherein one direction orthogonal to the vertical direction is defined as a lateral direction, the ground extension portion includes first and second ground extension portions extending so as to face a pair of inner wall surfaces of the through hole, which are provided so as to face each other in the lateral direction, respectively, and the first and second ground extension portions come into elastic contact with the inner wall surfaces of the through hole in opposite directions.

4. The socket for electronic components according to claim 3, wherein a direction orthogonal to the vertical direction and the lateral direction is defined as a longitudinal direction, the first ground extension portion extends in the longitudinal direction along the inner wall surface of the through hole and the second ground extension portion extends in the longitudinal direction along the inner wall surface of the through hole, and the holding member is fixed in the through hole so that one end of the first ground extension portion in the longitudinal direction and the other end of the second ground extension portion in the longitudinal direction come into pressure contact with the inner wall surface of the through hole.

* * * * *